(12) United States Patent
Sakurai

(10) Patent No.: US 7,583,157 B2
(45) Date of Patent: Sep. 1, 2009

(54) METHOD OF MANUFACTURING A TEMPERATURE COMPENSATED OSCILLATOR

(75) Inventor: Yasuhiro Sakurai, Sayama (JP)

(73) Assignee: Citizen Holdings Co., Ltd., Tokyo (JP)

( * ) Notice: Subject to any disclaimer, the term of this patent is extended or adjusted under 35 U.S.C. 154(b) by 0 days.

(21) Appl. No.: 11/544,622

(22) Filed: Oct. 10, 2006

(65) Prior Publication Data

US 2007/0030084 A1 Feb. 8, 2007

Related U.S. Application Data

(62) Division of application No. 10/501,774, filed as application No. PCT/JP03/00422 on Jan. 20, 2003.

(30) Foreign Application Priority Data

Jan. 21, 2002 (JP) ............................. 2002-11998

(51) Int. Cl.
*H03L 1/04* (2006.01)
(52) U.S. Cl. ..................... 331/176; 331/44; 331/66
(58) Field of Classification Search ............... 331/66, 331/74, 176, 44
See application file for complete search history.

(56) References Cited

U.S. PATENT DOCUMENTS

| | | | |
|---|---|---|---|
| 4,967,165 A | 10/1990 | Lee et al. | |
| 5,459,436 A * | 10/1995 | Pucci et al. | 331/66 |
| 5,481,229 A | 1/1996 | Connell et al. | |
| 5,604,468 A | 2/1997 | Gillig | |
| 5,731,742 A | 3/1998 | Wojewoda et al. | |
| 5,774,023 A | 6/1998 | Irwin | |
| 5,856,766 A | 1/1999 | Gillig et al. | |
| 5,892,408 A | 4/1999 | Binder | |
| 5,994,970 A | 11/1999 | Cole et al. | |
| 6,081,164 A | 6/2000 | Shigemori et al. | |
| 6,111,520 A | 8/2000 | Allen et al. | |

(Continued)

FOREIGN PATENT DOCUMENTS

EP    0 740 421 A1    10/1996

(Continued)

OTHER PUBLICATIONS

EP 03 701 125.1 Communication dated Feb. 24, 2006.

(Continued)

*Primary Examiner*—Robert Pascal
*Assistant Examiner*—James E Goodley
(74) *Attorney, Agent, or Firm*—Westernman, Hattori, Daniels & Adrian, LLP.

(57) ABSTRACT

A method of manufacturing a temperature compensated oscillator including the steps of assembling an oscillator in which an IC chip constituting a temperature compensation circuit with an oscillation circuit and a compensation data storage circuit, and a resonator for the oscillation circuit are mounted in a package; adjusting the resonator with an oscillation frequency of the oscillation circuit to a desired oscillation frequency in condition that the oscillator is kept at a reference temperature, in condition that a temperature compensation function of the temperature compensation circuit is disabled; sealing the resonator hermetically; creating temperature compensation data and storing it into the compensation data storage circuit; and enabling the temperature compensation function of the temperature compensation circuit.

9 Claims, 7 Drawing Sheets

U.S. PATENT DOCUMENTS

| | | | |
|---|---|---|---|
| RE36,973 | E | 11/2000 | Shigemori |
| 6,154,095 | A | 11/2000 | Shigemori et al. |
| 6,229,404 | B1 | 5/2001 | Hatanaka |
| 6,292,066 | B1 | 9/2001 | Shibuya et al. |
| 6,366,175 | B2 * | 4/2002 | Oka ............................ 331/116 |
| 6,456,168 | B1 * | 9/2002 | Luff ............................ 331/68 |
| 6,542,044 | B1 | 4/2003 | Berquist et al. |
| 6,577,203 | B2 | 6/2003 | Fuji et al. |
| 6,677,827 | B2 * | 1/2004 | Jung ............................ 331/176 |
| 6,788,159 | B2 | 9/2004 | Takahashi et al. |
| 6,882,835 | B2 | 4/2005 | Oka et al. |

FOREIGN PATENT DOCUMENTS

| | | |
|---|---|---|
| EP | 0 740 421 A3 | 10/1996 |
| JP | 54-89255 | 6/1979 |
| JP | 56-097896 A | 8/1981 |
| JP | 58-173488 A | 10/1983 |
| JP | 63-312704 A | 12/1988 |
| JP | 01-137004 A | 12/1989 |
| JP | 03-280605 A | 12/1991 |
| JP | 04-335704 A | 11/1992 |
| JP | 08-008740 A | 1/1996 |
| JP | 08-186442 A | 7/1996 |
| JP | 2001-57509 A | 2/2001 |
| KR | 10-0313329 A | 10/2001 |

OTHER PUBLICATIONS

TW 092101243 Communication dated Feb. 05, 2005.
Korean Oct. 2004-7011077 Communication dated Jun. 30, 2006.
PCT/JP03/00422 International Search Report dated Mar. 25, 2003.
European Search Report dated Aug. 01, 2006.

* cited by examiner

F I G. 6

| FREQUENCY DIVISION NUMBER | | FREQUENCY DIVISION RATIO (MULTIPLICATION NUMBER) | FREQUENCY OF OUTPUT SIGNAL (MHz) |
|---|---|---|---|
| N | M | | |
| . | . | . | . |
| . | . | . | . |
| . | . | . | . |
| . | . | . | . |
| 102 | 100 | 1.020 | 20.4 |
| 203 | 200 | 1.015 | 20.3 |
| 101 | 100 | 1.010 | 20.2 |
| 201 | 200 | 1.005 | 20.1 |
| 100 | 100 | 1.000 | 20.0 |
| 199 | 200 | 0.995 | 19.9 |
| 99 | 100 | 0.990 | 19.8 |
| 197 | 200 | 0.985 | 19.7 |
| 98 | 100 | 0.980 | 19.6 |
| . | . | . | . |
| . | . | . | . |
| . | . | . | . |
| . | . | . | . |

INCREMENT ↑ $f_c$ ↓ DECREMENT

METHOD OF MANUFACTURING A TEMPERATURE COMPENSATED OSCILLATOR

This application is a divisional of prior application Ser. No. 10/501,774, filed on Jul. 20, 2004 which is a § 371 of International Application PCT/JP03/00422 filed on Jan. 20, 2003, the entire contents of which are incorporated herein by reference.

TECHNICAL FIELD

The present invention relates to a temperature compensated oscillator in which the frequency of an output signal is kept substantially constant irrespective of a change in ambient temperature and, more specifically, to a temperature compensated oscillator in which its temperature compensation function can also be disabled.

BACKGROUND TECHNOLOGY

Temperature compensated oscillators (TCXOs) used in various fields are in heavy use in portable mobile communication devices such as a cellular phone and so on in recent years. Generally, as this kind of temperature compensated oscillator, a crystal oscillator is widely used in which an oscillation circuit is constituted of a 10 MHz band AT cut quartz crystal (resonator) as an oscillation source and provided with a temperature compensation circuit using some kind of frequency variable means so that the temperature characteristic in a cubic curve of the AT cut quartz crystal is cancelled to stabilize the oscillating frequency.

Further, based on the configuration of the temperature compensation circuit, the temperature compensated oscillators are roughly divided into an analog temperature compensated oscillator and a digital temperature compensated oscillator.

For these kinds of temperature compensated oscillators, a reduction in size and weight and a reduction in price as well as stability of an oscillation output signal are desired.

A package configuration example of a micro surface-mounted temperature compensated oscillator is shown in FIG. 8.

This temperature compensated oscillator has a package (container) 10 which is constituted of a package main body 11, a welded ring 12, and a cover 13, to the inside of which a quartz crystal (resonator) 15, a MOS IC (integrated circuit) chip 16 constituting an oscillation circuit and a temperature compensation circuit which will be later described, and a circuit element 17 such as a chip capacitor or the like are attached and sealed.

The temperature compensated oscillator has a circuit configuration as shown in FIG. 9. An oscillation circuit 20 forms an inverter oscillation circuit in which the quartz crystal 15, an inverter 21, and a feedback resistor 22 are connected in parallel, and their both connection points are grounded via DC cut capacitors Cc and Cd and voltage-controlled variable capacitors 23 and 24 which are oscillation capacitors, respectively.

Further, an output line 25 which outputs a signal based on an oscillation output is led out of the connection point on the output side of the inverter 21 and connected to an output terminal 26. It should be noted that another piezoelectric element can also be used as the resonator in place of the quartz crystal 15.

Furthermore, a temperature detection circuit 18 which detects the temperature state near the quartz crystal 15 in the oscillation circuit 20 by a thermister or the like and a temperature compensation circuit 30 for keeping the frequency of the signal to be outputted to the output line 25 of the oscillation circuit 20 constant based on the temperature detection signal from the temperature detection circuit 18, are provided.

The temperature compensation circuit 30 comprises a compensation data storage circuit (non-volatile memory) 31 which stores compensation data for performing temperature compensation and a D/A conversion circuit 32 which generates a control voltage based on the compensation data and the temperature detection signal from the temperature detection circuit 18.

Then, the control voltage outputted from the D/A conversion circuit 32 is applied to the positive electrode side of the voltage-controlled variable capacitors 23 and 24 (the connection points with the DC cut capacitors Cc and Cd) via resistors R1 and R2 provided in the oscillation circuit 20 respectively, so as to change the capacitances of the voltage-controlled variable capacitors 23 and 24 in accordance with the voltage. This controls the oscillation frequency of the oscillation circuit 20 to keep the frequency of the output signal substantially constant.

In such temperature compensated oscillators, all of the quartz crystals 15 and the oscillation circuits 20 formed in the IC chips 16 cannot be formed completely the same due to variation in manufacturing or the like, and therefore they will individually have different temperature-frequency characteristics. Accordingly, all of the oscillation circuits 20 cannot be temperature-compensated based on the same reference.

Therefore, it is necessary to create individual compensation data different for each oscillation circuit and store it into the compensation data storage circuit 31. However, the oscillation circuits cannot be sufficiently compensated if the quartz crystals 15 exhibit a wide range of characteristic variation, and it is therefore necessary to adjust as much as possible the characteristics of the quartz crystals 15 in advance.

Hence, the adjustment work has conventionally been performed as in the following steps.

Step 1: Only the piezoelectric element such as the quartz crystal 15 or the like is mounted in the package (the package main body 11 in FIG. 8).

Step 2: The package is kept at a reference temperature (generally at room temperature: 25° C.), and an electrode film on the surface of the piezoelectric element is removed by an ion beam or the like while the resonant frequency of the piezoelectric element is being monitored by a network analyzer or the like to adjust the frequency to a desired frequency.

Step 3: The IC chip constituting the oscillation circuit and the temperature compensation circuit is mounted in the package.

Step 4: The package is exposed to a plurality of temperature states, and the oscillation frequency is measured in each of the temperature states to measure the difference with respect to the desired oscillation frequency $f_o$.

Step 5: Based on the measurement values, temperature compensation data is created and stored into the compensation data storage circuit (non-volatile memory) of the IC chip.

As described above, in the conventional adjustment method of the temperature compensated oscillator, the IC chip constituting the oscillation circuit is not mounted when the characteristics of the piezoelectric element such as the quartz crystal or the like is adjusted, but the piezoelectric element is caused to resonate and its resonant frequency is monitored from the outside by the network analyzer or the like and the electrode film on the surface of the piezoelectric element is removed so that the frequency has a desired value.

Accordingly, there has been a problem that deviation arises between the oscillation frequency when the IC chip is also mounted in the package to make up the oscillation circuit together with the piezoelectric element and the circuit is caused to perform oscillation operation and the previously adjusted resonant frequency. In addition, the number of adjustment steps has been large which requires extra adjustment cost.

Hence, it is conceivable that the piezoelectric element and the IC chip are mounted in the package and the oscillation circuit is caused to operate, and its oscillation frequency is monitored so that adjustment of the resonant frequency of the piezoelectric element at room temperature and creation of the compensation data thereafter can be performed in sequence in a state close to the actual use state, in which case, however, the temperature compensation circuit also operates. In addition, no compensation data is stored in the temperature compensation data storage circuit in the initial state, but the initial value of the register for storing the data is unknown such that bits thereof are all "0" in some case and are all "1" in the other case. This brings about a problem that it is impossible to perform appropriate adjustment of the resonant frequency of the piezoelectric element such as the quartz crystal or the like and proper creation of the compensation data thereafter.

DISCLOSURE OF THE INVENTION

The invention has been developed to solve the problems described above, and its aspect is to make it possible, in a state in which a piezoelectric element such as a quartz crystal or the like, an IC chip, and so on are mounted in a package to constitute a temperature compensated oscillator, to allow its oscillation circuit to operate so as to accurately adjust the temperature characteristics of the piezoelectric element itself, and thereafter subsequently create compensation data and store it into a compensation data storage circuit, thereby simplifying adjustment steps of the temperature compensated oscillator and increasing the accuracy thereof.

Hence, to achieve the above-described aspect, the invention is a temperature compensated oscillator comprising: an oscillation circuit whose oscillation frequency varies with a temperature change; an output line for outputting a signal based on an oscillation output of the oscillation circuit; a temperature detection circuit for detecting a temperature state near the oscillation circuit; and a temperature compensation circuit for keeping a frequency of the signal outputted to the output line substantially constant based on its temperature detection signal, wherein a selection means is provided which selects whether to enable or disable a temperature compensation function of the temperature compensation circuit.

Further, it is also adoptable to provide a variable frequency division circuit between the above-described circuit and the output line, wherein the selection means has means for allowing the temperature compensation circuit to vary a frequency division ratio of the variable frequency division circuit depending on a temperature detected by the temperature detection circuit when enabling the temperature compensation function of the temperature compensation circuit, and fixing the frequency division ratio of the frequency division circuit to a predetermined value when disabling the temperature compensation function.

In these temperature compensated oscillators, it is also adoptable that the oscillation circuit has an oscillation capacitor, and that the selection means has means for allowing the temperature compensation circuit to vary a capacitance value of the oscillation capacitor depending on a temperature detected by the temperature detection circuit when enabling the temperature compensation function of the temperature compensation circuit, and fixing the capacitance of the oscillation capacitor to a predetermined capacitance value when disabling the temperature compensation function.

It is preferable that the oscillation capacitor includes a variable capacitor which varies in capacitance value in accordance with a voltage applied thereto, and the temperature compensation circuit has means for changing the voltage applied to the variable capacitor to change the capacitance value of the oscillation capacitor.

In the above case, it is preferable that the selection means has means for fixing the voltage applied to the variable capacitor to a predetermined value when fixing the capacitance of the oscillation capacitor to the predetermined capacitance value.

Alternatively, it is adoptable that the oscillation capacitor includes a plurality of fixed capacitors, and the temperature compensation circuit has means for changing connection states of the plurality of fixed capacitors to change the capacitance of the oscillation capacitor.

In the above case, it is preferable that the selection means has means for separating the variable capacitor so that the variable capacitor is not included in the oscillation capacitor when fixing the capacitance of the oscillation capacitor to the predetermined capacitance value.

It is preferable that these temperature compensated oscillators further comprise a selection information storage circuit which stores control information for controlling a selection state of the selection means.

Further, it is desirable to provide a compensation data storage circuit which stores temperature compensation data of the temperature compensation circuit.

It is also adoptable to provide both a selection information storage circuit and a compensation data storage circuit, in which case both the circuits can be formed of an integrated storage circuit (for example, one non-volatile memory).

It is also adoptable to provide a control information input terminal for inputting from outside control information for controlling a selection state of the selection means. The control information input terminal may be an external terminal provided on a package constituting the temperature compensated oscillator.

It is also adoptable that the selection information storage circuit is composed of a predetermined conductive pattern and stores information for controlling a selection state of the selection means caused by the conductive pattern being cut.

BRIEF DESCRIPTION OF DRAWINGS

FIG. 6 is a chart showing an example of the relationship among frequency division data M and N and a frequency division ratio (multiplication number) by the same variable frequency division circuit and a frequency of an output signal;

BEST MODE FOR CARRYING OUT THE INVENTION

In order to detail the present invention, preferred embodiments of the invention will be explained using the accompanying drawings.

FIRST EMBODIMENT

Figure 1:
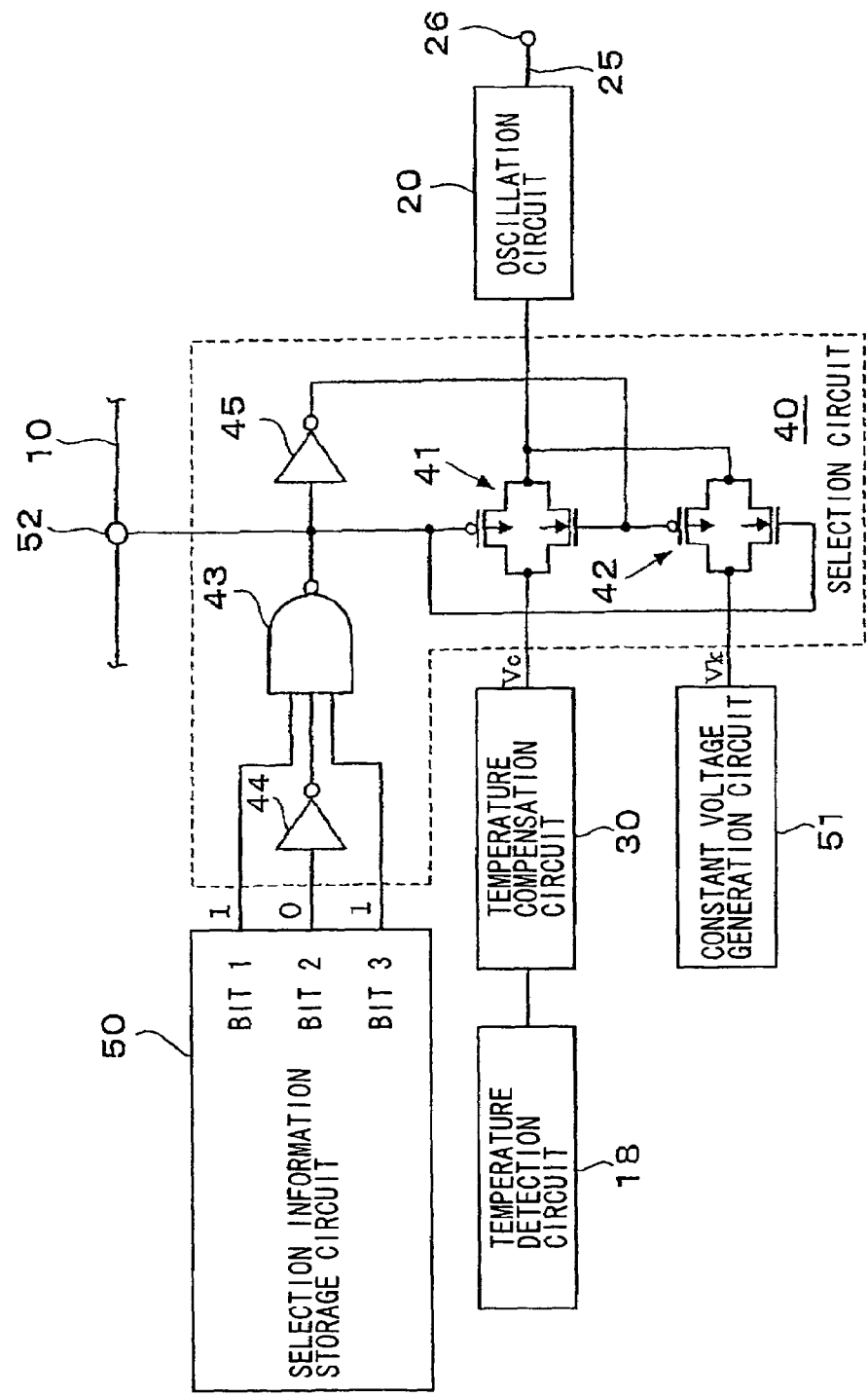
FIG. 1 is a block circuit diagram showing the configuration of a first embodiment of a temperature compensated oscillator according to the invention.
Figure 8:
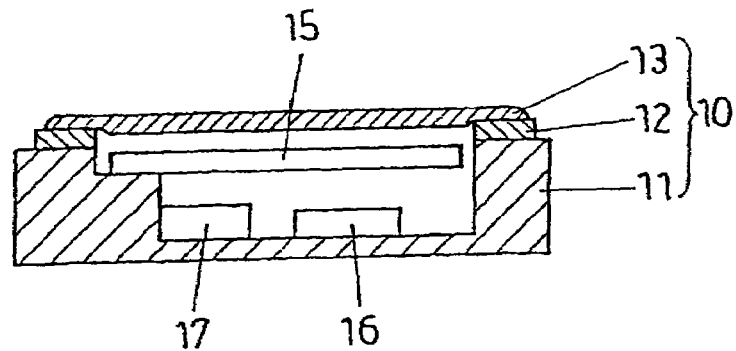
FIG. 8 is a schematic cross-sectional view showing an example of a package of the temperature compensated oscillator.
Figure 9:
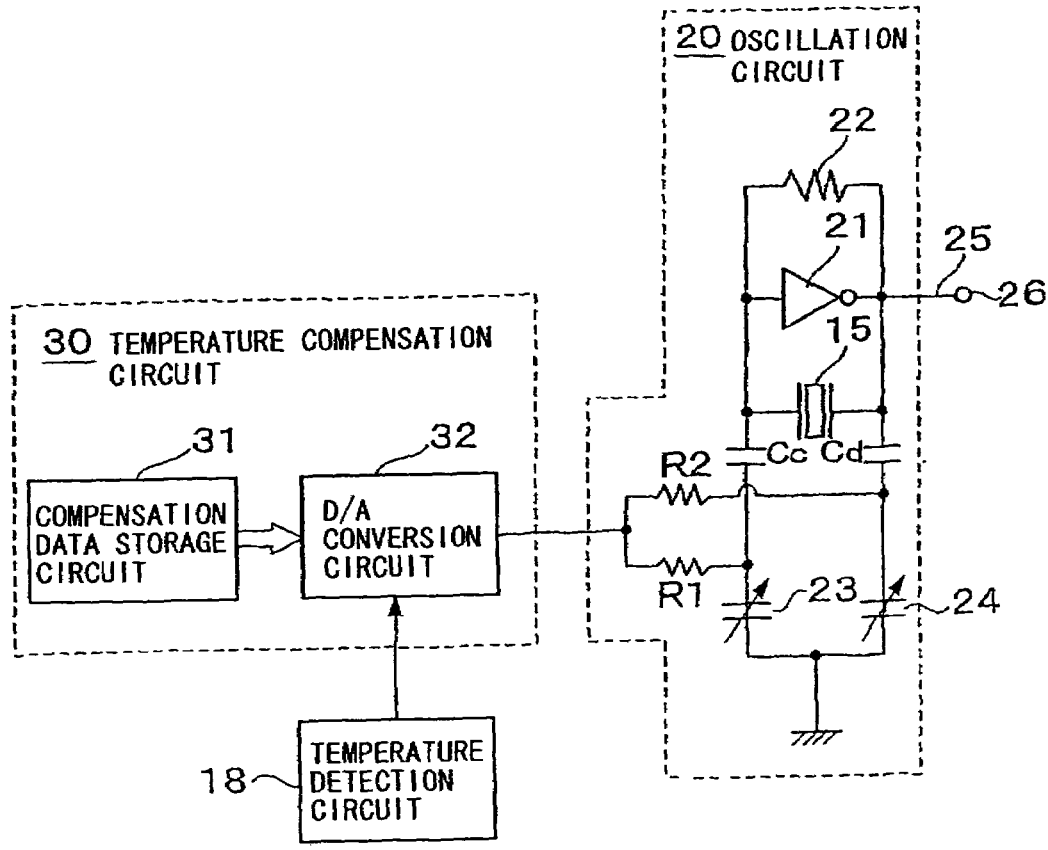
FIG. 9 is a block circuit diagram showing a configuration example of a conventional temperature compensated oscillator.

FIG. 1 is a block circuit diagram showing the configuration of a first embodiment of a temperature compensated oscillator according to the invention, in which portions equivalent to those in FIG. 8 and FIG. 9 are assigned the same numerals and symbols, and the description thereof will be omitted.

The temperature compensated oscillator shown in FIG. 1 comprises an oscillation circuit 20 having an output line 25 and an output terminal 26, a temperature detection circuit 18, and a temperature compensation circuit 30 which are similar to those of the conventional example shown in FIG. 9. The oscillator further comprises, as components specific to this embodiment, a selection circuit 40 that is a selection means, a selection information storage circuit (non-volatile memory) 50 which stores control information for controlling the selection state of the selection circuit 40, and a constant voltage generation circuit 51 which outputs a constant voltage Vk.

In addition to the selection information storage circuit 50, a control information input terminal to which control information for controlling the selection state of the selection circuit 40 is inputted is further provided outside the package 10 shown in FIG. 8 as an external terminal 52. This control information input terminal may be provided inside the package main body 11.

The selection circuit 40 is constituted of a pair of transmission gates 41 and 42, a three-input NAND circuit 43, and two inverters (NOT circuits) 44 and 45.

A control voltage Vc that is the output of the temperature compensation circuit 30 is applied to a common connection point of the resistors R1 and R2 shown in FIG. 9 of the oscillation circuit 20 via one transmission gate 41. The constant voltage Vk that is the output of the constant voltage generation circuit 51 is applied similarly to the common connection point of the resistors R1 and R2 of the oscillation circuit 20 via the other transmission gate 42.

The selection information storage circuit 50 outputs 3 bits of selection information, so that outputs of a bit 1 and a bit 3 become two inputs to the three-input NAND circuit 43 as they are and an output of a bit 2 is inverted by the inverter 44 to become the other input to the NAND circuit 43. Accordingly, only when the selection information outputted from the selection information storage circuit 50 is "101," all of the three inputs of the NAND circuit 43 become "1" so that its output becomes "0."

The output of the NAND circuit 43 is directly applied to the gate on the negative logic side of the transmission gate 41 and the gate on the positive logic side of the transmission gate 42, and is inverted by the inverter 45 and applied to the gate on the positive logic side of the transmission gate 41 and the gate on the negative logic side of the transmission gate 42.

Therefore, only when the selection information outputted from the selection information storage circuit 50 is "101," the transmission gate 41 is turned on while the transmission gate 42 is turned off, and therefore the control voltage Vc outputted from the temperature compensation circuit 30 passes through the transmission gate 41 and is applied to the oscillation circuit 20 to be applied to the voltage controlled variable capacitors 23 and 24 via the resistors R1 and R2 shown in FIG. 9, whereby the capacitance value of the oscillation capacitor varies depending on the temperature so that the oscillation frequency of the oscillation circuit 20 is temperature-compensated to be kept constant.

When the selection information outputted from the selection information storage circuit 50 is other than "101," the transmission gate 42 is turned on while the transmission gate 41 is turned off, and therefore the constant voltage Vk outputted from the constant voltage generation circuit 51 passes through the transmission gate 42 and is applied to the oscillation circuit 20 to be applied to the voltage controlled variable capacitors 23 and 24 via the resistors R1 and R2 shown in FIG. 9, whereby the capacitance value of the oscillation capacitor is fixed to predetermined capacitance value in accordance with the constant voltage so that the oscillation frequency of the oscillation circuit 20 is not temperature-compensated.

Accordingly, the selection circuit 40 selects either to supply the control voltage Vc from the temperature compensation circuit 30 to the oscillation circuit 20 to enable the temperature compensation function or to supply the constant (fixed) voltage Vk from the constant voltage generation circuit to the oscillation circuit 20 to disable the temperature compensation function, based on the 3-bit selection information outputted from the selection information storage circuit 50.

The switching in the selection circuit 40 can be performed also by applying to the external terminal 52 a signal (voltage) at a high level "1" or a signal (voltage) at a low level "0" as the control information.

When the control information input terminal such as the external terminal 52 is provided, the selection information storage circuit 50 and the NAND circuit 43 and the inverter 44 in the selection circuit 40 may be omitted.

According to this temperature compensated oscillator, the initial adjustment of the quartz crystal in the oscillation circuit 20 and the adjustment work of creating and storing the temperature compensation data can be performed in a state in which the quartz crystal and the IC chip constituting the oscillation circuit, the temperature compensation circuit, and so on are mounted in the package to complete the temperature compensated oscillator and the oscillation circuit 20 is operated. At the time of adjustment, the selection information of the selection information storage circuit 50 is set to other than "101" to disable the temperature compensation function, and the oscillation circuit 20 is caused to perform oscillation operation with a predetermined oscillation capacitance.

The steps of the adjustment work are as follows.

Step 1: The IC chip constituting the oscillation circuit 20 and the circuits shown in FIG. 1 is mounted in the package (for example, the package main body 11 shown in FIG. 8), and then the quartz crystal is mounted therein.

Step 2: The package is kept at a reference temperature (generally at room temperature: 25° C.), the temperature compensation function of the temperature compensated oscillator is disabled whereby the temperature compensated oscillator is caused to operate as a simple oscillator, and an electrode film on the surface of the quartz crystal is removed by an ion beam or the like while its oscillation frequency is being monitored by a network analyzer or the like to adjust the frequency to a desired oscillation frequency $f_0$.

Step 3: A cover is attached to the package to hermetically seal the quartz crystal.

Step 4: The package is exposed to a plurality of temperature states, and the oscillation frequency is measured in each of temperature states to measure the difference with respect to the desired oscillation frequency $f_0$.

Step 5: Based on the measurement values, temperature compensation data is created and stored into the compensation data storage circuit (non-volatile memory) of the IC chip.

After the adjustment, by bringing the selection information of the selection information storage circuit 50 into "101," the temperature compensation function is enabled, whereby the temperature compensated oscillator is allowed to normally operate, resulting in a finished micro temperature compensated oscillator.

Accordingly, the temperature characteristics of the quartz crystal can be accurately adjusted, unaffected by the temperature compensation circuit while the oscillation circuit is oscillating as in the actual use state, and the work of creating the compensation data thereafter and storing it into the compensation data storage circuit can also be accurately performed subsequent thereto. This makes it possible to simplify the adjustment steps of the temperature compensated oscillator and increase the accuracy thereof.

In step 2, keeping the package at the reference temperature (generally at room temperature: 25° C.) is preferably accomplished by putting the package into a constant temperature chamber and performing the adjustment work.

In step 4, exposure of the package to the plurality of temperature states is preferably accomplished by changing the set temperature of the constant temperature chamber in sequence or by sequentially housing the package into a plurality of constant temperature chamber which are set at different temperatures. The measurement temperature range is the operation guaranteed temperature range of this oscillator and should be, for example, set at appropriate points (for example, about 11 points) from minus 40° C. to plus 100° C.

The adjustment of the reference frequency of the quartz crystal is accomplished by depositing metal film such as silver or the like on the surface of the quartz crystal to form it in a film thickness (relatively thick) which allows the resonant frequency to be lower than the reference frequency in advance, and applying an ion beam to the electrode film on the surface of the quartz crystal using an ion gun or performing sputter etching for the electrode film to gradually decrease the mass of the electrode film.

Note that this applies to the case in which another piezoelectric element is used as the resonator of the oscillation circuit in place of the quartz crystal.

The temperature characteristics of the oscillation frequency of the oscillation circuit using the AT cut quartz crystal as a resonator exhibit an almost cubic curb, and therefore even if the oscillation frequency is adjusted to become the desired frequency $f_0$ at the reference temperature, the oscillation frequency deviates therefrom due to a change in the environmental temperature. For this reason, the temperature is actually changed from the lower limit to the upper limit within the use guaranteed temperature range, and the actual oscillation frequency of the oscillation circuit, that is, the frequency of the signal outputted to the output terminal 26 is measured at each of the temperature states (measurement points) to measure the difference with respect to the desired oscillation frequency $f_0$.

Then, temperature compensation data necessary for generation of the control voltage Vc for bringing the difference to 0 in the temperature compensation circuit 30 is calculated and written into the compensation data storage circuit (non-volatile memory) 31 shown in FIG. 9 corresponding to temperature data.

It should be noted that the more measurement points are set, the more highly accurate temperature compensation data can be created, but the longer the measurement time becomes, and therefore it is preferable to estimate the cubic curve of the temperature characteristics of the oscillation circuit from the measurement result in the appropriate number (for example, about 11 points) of temperature states, also create by interpolation temperature compensation data for temperatures between the measurement points, and write the data into the compensation data storage circuit.

Another Example 1 of Oscillation Circuit

Figure 2:
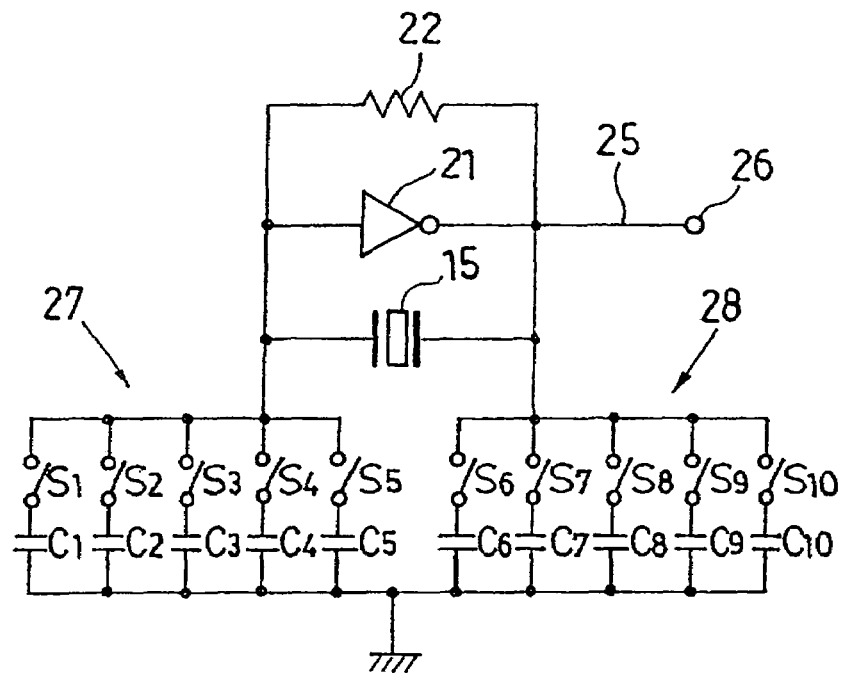
FIG. 2 is a circuit diagram showing another example of its oscillation circuit.
Figure 3:
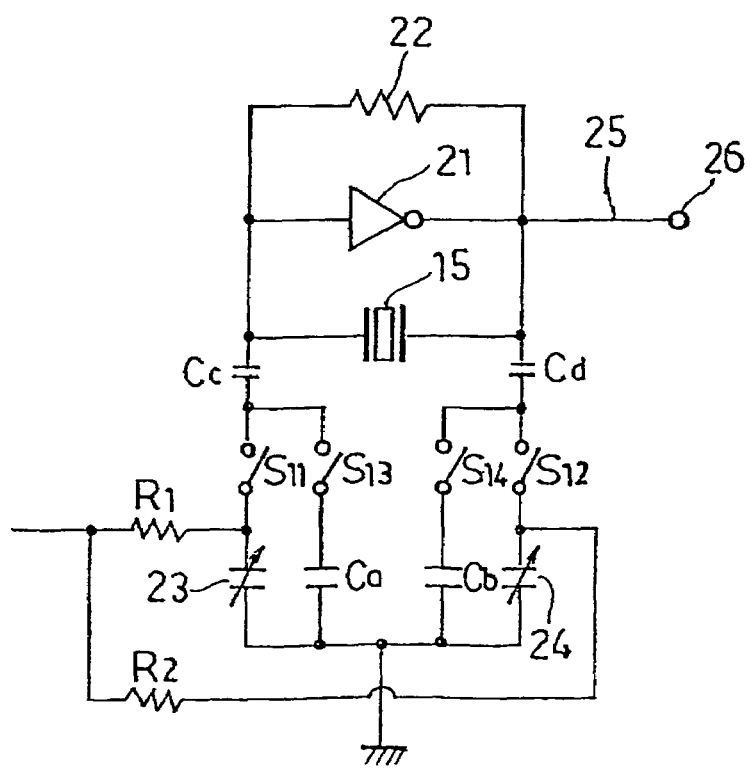
FIG. 3 is a circuit diagram showing still another example of the same oscillation circuit.

Next, another example of the oscillation circuit, in particular, its oscillation capacitor and it's capacitance variable means are shown in FIG. 2 and FIG. 3.

The oscillation circuit shown in FIG. 2 forms, similarly to the oscillation circuit 20 shown in FIG. 9, an inverter oscillation circuit in which a quartz crystal 15, an inverter 21, and a feedback resistor 22 are connected in parallel, and their both connection points are grounded via oscillation capacitors, respectively. As the each oscillation capacitor, however, parallel circuits composed of a plurality of fixed capacitors are used in place of the voltage controlled variable capacitor.

More specifically, a first capacitor array 27 in which capacitors C1 to C5 are connected in parallel via switches S1 to S5 is provided between the input side of the inverter 21 and the earth, and capacitors C6 to C10 are connected in parallel via switches S7 to S10 to form a second capacitor array 28 which is provided between the output side of the inverter 21 and the earth. It is preferable to use a switching element such as a MOS-FET or the like as each of the switches S1 to S10.

In this case, in place of the D/A conversion circuit shown in FIG. 9, a circuit is provided, as the temperature compensation circuit, which reads the compensation data corresponding to the temperature detection data by a temperature detection circuit 18 from a compensation data storage circuit 31 and outputs a variable switch control signal for controlling the ON/OFF state of the switches S1 to S10 of the oscillation circuit.

Further, in place of the constant voltage generation circuit 51 shown in FIG. 1, a circuit is provided which generates a fixed switch control signal for turning on predetermined switches of the switches S1 to S10 (for example, the switches S1 to S3 and S6 to S8) of the oscillation circuit and turns off the other switches, so that either the fixed switch control signal or the variable switch control signal generated by the above-described temperature compensation circuit is selected by a selection means and applied to each control electrode of the switches S1 to S10 of the oscillation circuit so as to control ON/OFF of the switches.

When the temperature compensation function is disabled at the time of initial adjustment, the above-described fixed switch control signal is selected by the selection means and inputted into the oscillation circuit to turn on, for example, the switches S1 to S3 and S6 to S8 and turn off the other switches. This fixes the capacitance value of the first capacitor array 27 to the capacitance value of the parallel circuit composed of the capacitors C1 to C3, and the capacitance value of the second capacitor array 28 to the capacitance value of the parallel circuit composed of the capacitors C6 to C8. Accordingly, the oscillation capacitance becomes constant irrespective of temperature change.

After the initial adjustment, when the temperature compensation function is enabled, the variable switch control signal from the temperature compensation circuit is selected by the selection means and inputted into the oscillation circuit to selectively turn on one or more of the switches S1 to S5 of the first capacitor array 27 and of the switches S6 to S10 of the second capacitor array 28 each. This changes the combination (connection state) of the enabled capacitors of the first capacitor array 27 and the second capacitor array 28 to vary the capacitance values (oscillation capacitance) of the capacitor arrays 27 and 28 depending on the temperature change.

For example, where the state in which the switches S1 to S3 of the first capacitor array 27 and S6 to S8 of the second capacitor array 28 are turned on so that the capacitors C1 to C3 and the capacitors C6 to C8 are connected in parallel respectively is defined as a normal state, when either the switch S1 or S2 or both is/are turned off and either the switch S6 or S7 or both is/are turned on from the above state, the capacitance values by the first capacitor array 27 and the second capacitor array 28 decrease. Besides, when either the switch S4 or S5 or both is/are turned on and either the switch S9 or S10 or both is/are turned on from the normal state, the capacitance values by the first capacitor array 27 and the second capacitor array 28 increase.

Further, the number of capacitors constituting the first capacitor array 27 and the second capacitor array 28 and the capacitance value of each of the capacitors are appropriately selected and their the connection state is changed, whereby the oscillation frequency can be temperature-compensated with the oscillation capacitance being considerably finely controlled.

Another Example 2 of Oscillation Circuit

In the oscillation circuit shown in FIG. 3, series switches S11 and S12 are inserted into the voltage controlled variable capacitors 23 and 24 in the oscillation circuit 20 shown in FIG. 9, respectively, and a series circuit composed of a capacitor Ca and a switch S13 and a series circuit composed of a capacitor Cb and a switch S14 are connected in parallel to the series circuit including the switch S11 and the series circuit including the switch S12 respectively. The capacitors Ca and Cb are fixed capacitors and the capacitors Cc and Cd are DC component cut capacitors.

When the temperature compensation function is disabled at the time of initial adjustment, the switches S11 and S12 are turned off and the switches S13 and S14 are turned on by the selection circuit, whereby the oscillation capacitance is fixed to the capacitance values of the capacitors Ca and Cb. The voltage controlled variable capacitors 23 and 24 are brought into a separated state so that they are not included in the oscillation capacitor.

After the initial adjustment, when the temperature compensation function is enabled, the switches S11 and S12 are turned on and the switches S13 and S14 are turned off by the selection circuit, whereby the voltage controlled variable capacitors 23 and 24 become the oscillation capacitor and the control voltage from the temperature compensation circuit is applied thereto via the resistors R1 and R2 so that each of their capacitance values varies depending on the temperature change and, as a result, the oscillation frequency can be temperature-compensated.

Note that another piezoelectric element can be used as the resonator in place of the quartz crystal also in these oscillation circuits.

SECOND EMBODIMENT

Figure 4:
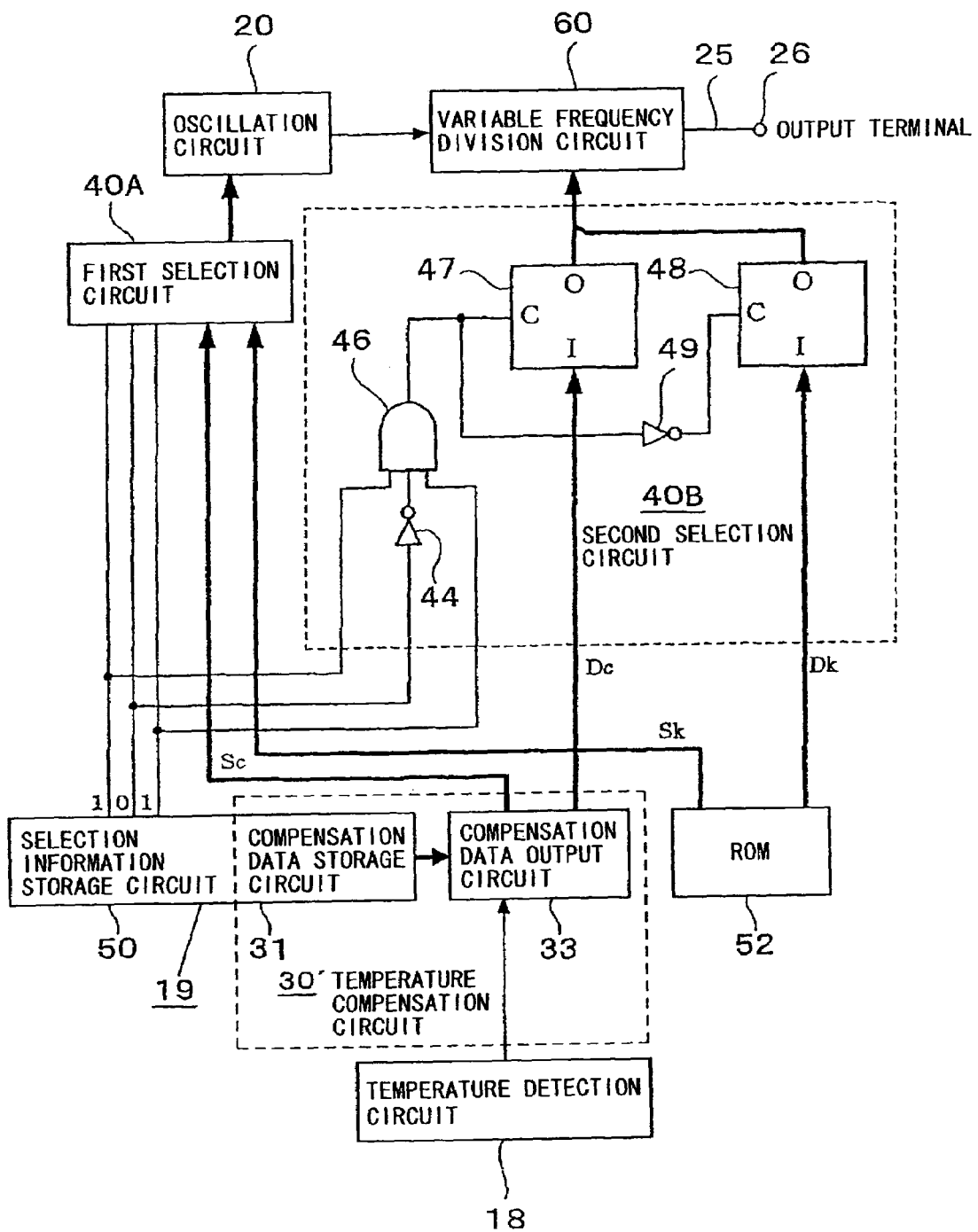
FIG. 4 is a block circuit diagram showing the configuration of a second embodiment of the temperature compensated oscillator according to the invention.

Next, a second embodiment of the temperature compensated oscillator according to the invention will be described with FIG. 4. In FIG. 4, portions equivalent to those in FIG. 1 and FIG. 9 are assigned the same numerals and symbols, and the description thereof will be omitted. Incidentally, a compensation data storage circuit 31 and a selection information storage circuit 50 of the temperature compensation circuit in this embodiment form an integrated storage circuit, and one non-volatile memory 19 serves as both of them such that most of the storage region is used as the compensation data storage circuit 31 and a part of the region is used as the selection information storage circuit 50.

In the temperature compensated oscillator shown in FIG. 4, a variable frequency division circuit 60 is provided between an oscillation circuit 20 and an output line 25, and a first selection circuit 40A and a second selection circuit 40B are provided as a selection means. The first and second selection circuits 40A and 40B have the same circuit configuration, and each is constituted of digital gate circuits 47 and 48 and a three-input AND circuit 46, and two inverters (NOT circuits) 44 and 49 as shown in the second selection circuit 40B.

Out of 3 bits of selection information outputted by the selection information storage circuit 50, outputs of a bit 1 and a bit 3 become two inputs to the three-input AND circuit 46 as they are, and an output of a bit 2 is inverted by the inverter 44 to become the other input to the AND circuit 46. Accordingly, only when the selection information outputted from the selection information storage circuit 50 is "101," all of the three inputs of the AND circuit 46 are "1" so that its output becomes "1." When the selection information outputted from the selection information storage circuit 50 is other than "101," the output of the AND circuit 46 becomes "0."

The output of the AND circuit 46 is directly applied to a control terminal C of the digital gate circuit 47, and is inverted by the inverter 49 and applied to the control terminal C of the digital gate circuit 48.

Therefore, only when the selection information outputted from the selection information storage circuit 50 is "101," the digital gate circuit 47 is turned on while the digital gate circuit 48 is turned off, and therefore the second selection circuit 40B selects a variable frequency division number data Dc inputted from a compensation data output circuit 33 of a temperature compensation circuit 30' and outputs it to the variable frequency division circuit 60, and when the selection information outputted from the selection information storage circuit 50 is other than "101," the digital gate circuit 48 is turned on while the digital gate circuit 47 is turned off, and therefore the second selection circuit 40B selects a fixed frequency division number data Dk inputted from a ROM 52 and outputs it to the variable frequency division circuit 60.

The first selection circuit 40A has completely the same configuration as the above but is different only in that what is to be selected is switch control data Sc or Sk and the output destination of the selected switch control data is the oscillation circuit 20.

The compensation data output circuit 33 of the temperature compensation circuit 30' outputs variable switch control signal (digital data) Sc and frequency division number data Dc for performing temperature compensation with reference to the compensation data in the compensation data storage circuit 31 in accordance with the data on temperature detected by the temperature detection circuit 18 and inputs them into the digital gate circuits 47 of the first and second selection circuits 40A and 40B respectively.

On the other hand, in the ROM 52 that is a read only memory, fixed switch control signal (digital data) Sk and frequency division number data Dk are stored in advance, and each data is read out by a not-shown read circuit and inputted into the digital gate circuits 48 of the first and second selection circuits 40A and 40B respectively.

Then, the first selection circuit 40A selects the variable switch control signal Sc inputted from the compensation data output circuit 33 of the temperature compensation circuit 30' and outputs it to the oscillation circuit 20 only when the selection information outputted from the selection information storage circuit 50 is "101," and selects the fixed switch control signal Sk inputted from the ROM 52 and outputs it to the oscillation circuit 20 when the selection information outputted from the selection information storage circuit 50 is other than "101."

The oscillation circuit 20, as shown, for example, in FIG. 2, is a circuit using first and second capacitor arrays 27 and 28 in each of which many capacitors are provided in parallel via switches as the oscillation capacitor, and ON/OFF of each of switches S1 to S10 is controlled by the switch control signal (digital data) Sc or Sk outputted from the first selection circuit 40A, whereby the oscillation capacitance can be controlled to vary the oscillation frequency. As the switches S1 to S10 shown in FIG. 2, electronic switches are used whose ON/OFF can be controlled by a 1-bit digital signal, such as MOS-type analog switches or the like.

Figure 5:
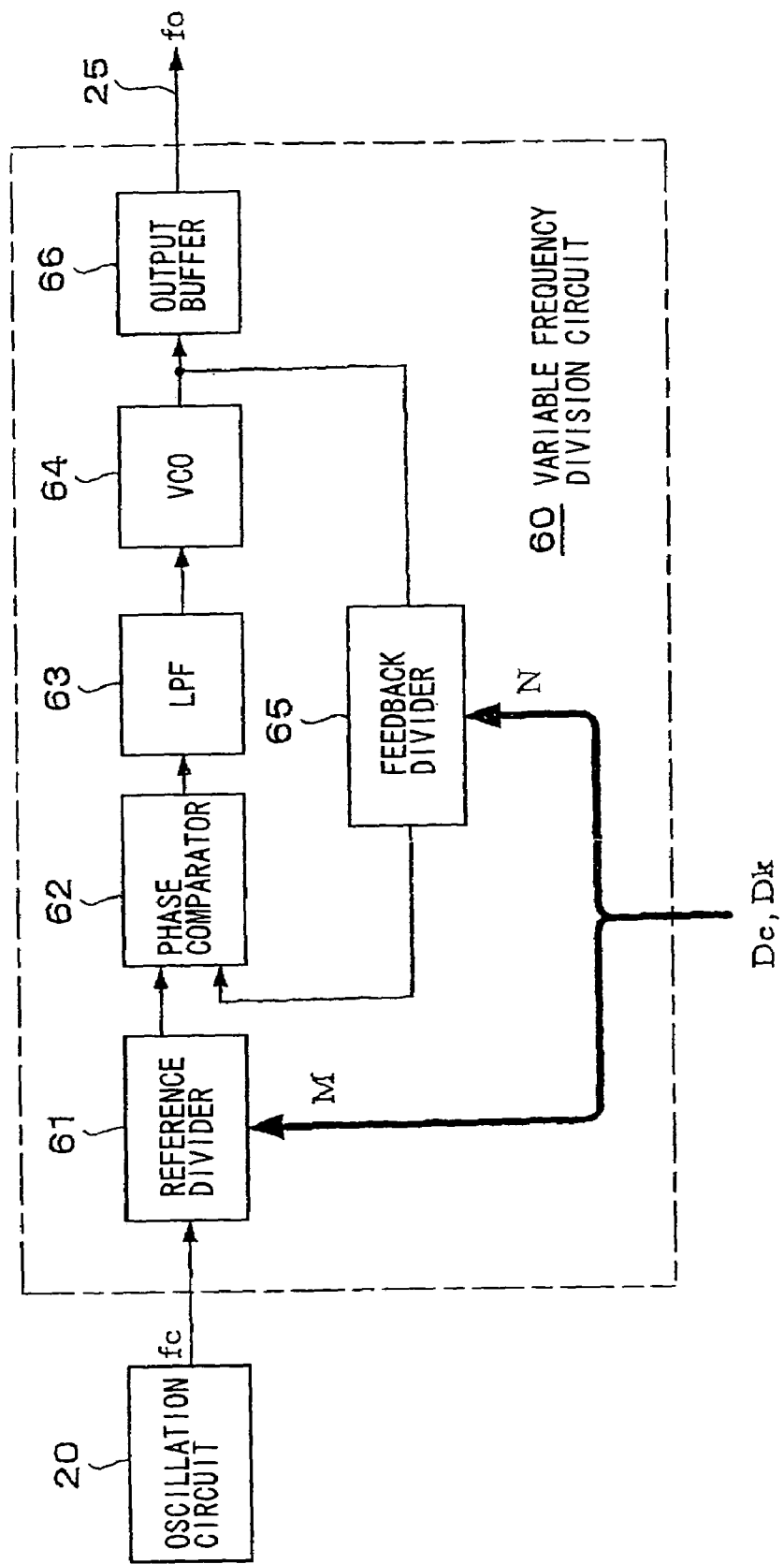
FIG. 5 is a block diagram showing an example of a variable frequency division circuit in FIG. 4.

As the variable frequency division circuit 60, a well-known circuit is used, and an example thereof will be described with FIG. 5. This variable frequency division circuit 60 is constituted of a reference divider 61, a phase comparator 62, a low-pass filter (hereinafter, abbreviated as an "LPF") 63, a voltage controlled oscillation circuit (hereinafter, abbreviated as a "VCO") 64, a feedback divider 65, and an output buffer 66.

The oscillation output signal from the oscillation circuit 20 is divided by the reference divider 61 and inputted into the phase comparator 62 as a reference signal. On the other hand, the oscillation signal of the VCO 64 is divided by the feedback divider 65 and inputted into the phase comparator 62 as a comparison signal. The phase comparator 62 outputs a voltage in accordance with the phase difference between the two input signals, and the voltage is supplied to the VCO 64 via the LPF 63 to control the oscillation frequency of the VCO 64. The oscillation signal of the VCO is outputted to the output line 25 via the output buffer 66.

Both the reference divider 61 and the feedback divider 65 are programmable dividers each capable of dividing the frequency by a variable integral value.

The frequency fo of the output signal of the variable frequency division circuit 60 is determined by a frequency division number M of the reference divider 61 and a frequency division number N of the feedback divider 65 assuming that the frequency of the oscillation output signal from the oscillation circuit 20 is fc, and the relation among them is expressed by the following equation.

$$fo = fc \times N/M$$

The reference divider 61 divides the frequency of the input signal into 1/M and outputs it, and the feedback divider 65 divides the frequency of the input signal into 1/N and outputs it.

N/M is the frequency division ratio (multiplication number in this case) and can arbitrarily be set by the values of the frequency division numbers M and N. For example, taking M=N=100 as a reference value, the values of the frequency division numbers M and N are changed as shown in FIG. 6, whereby the frequency division ratio (multiplication number) can be incremented or decremented by 0.005 starting from 1.000.

Accordingly, when the frequency fc of the oscillation output signal from the oscillation circuit 20 is 20 MHz, the frequency fo of the output signal can be incremented or decremented by 0.1 MHz with respect to 20 MHz.

Hence, the fixed frequency division number data Dk to be stored in the ROM 52 shown in FIG. 4 is constituted of the frequency division numbers M and N which are set as M=N=100, and the variable frequency division number data Dc outputted from the compensation data output circuit 33 is also constituted of the frequency division numbers M and N as shown in FIG. 6, whereby when the second selection circuit 40B in FIG. 4 selects the fixed frequency division number data Dk from the ROM 52 and inputs it into the variable frequency division circuit 60, the frequency division ratio becomes 1.000 because M=N=100, and the frequency fo of the output signal becomes equal to the frequency fc (20 MHz in the example in FIG. 6) of the oscillation output signal from the oscillation circuit 20.

When the second selection circuit 40B in FIG. 4 selects the variable frequency division number data Dc outputted from the compensation data output circuit 33 and inputs it into the variable frequency division circuit 60, the frequency division ratio can be variously changed by the frequency division numbers M and N constituting the frequency division number data Dc, so that in the example shown in FIG. 6 the frequency division ratio (multiplication number) can be incremented or decremented by 0.005 starting from 1.000 to increment or decrement the frequency fo of the output signal by 0.1 MHz with reference to 20 MHz.

The minimum variable width (increment/decrement width) and the maximum variable range of the frequency division ratio (multiplication number) can be arbitrarily set by selection of the frequency division numbers M and N.

According to this embodiment, the selection information storage circuit 50 has the 3-bit selection information which is other than "101" during the time of initial adjustment until the resonant frequency of the quartz crystal of the oscillation circuit 20 is adjusted and the compensation data is created and stored into the compensation data storage circuit 31.

Accordingly, the first selection circuit 40A selects the fixed switch control circuit Sk inputted from the ROM 52 and outputs it to the oscillation circuit 20. Further, the second selection circuit 40B selects the fixed frequency division number data Dk also inputted from the ROM 52 and outputs it to the variable frequency division circuit 60.

As a result, the fixed switch control signal Sk turns on, for example, only the switches S1 to S3 and S6 to S8 shown in FIG. 2 and turns off the other switches in the oscillation circuit 20.

Therefore, the capacitance value of the first capacitor array 27 is fixed to the capacitance value of the parallel circuit composed of the capacitors C1 to C3, and the capacitance value of the second capacitor array 28 is fixed to the capacitance value of the parallel circuit composed of the capacitors C6 to C8. This is the normal state in which the oscillation capacitance becomes constant irrespective of a temperature change so that the frequency fc of the oscillation output signal somewhat varies depending on the temperature characteristics of the quartz crystal 15 but is not temperature-compensated.

On the other hand, in the variable frequency division circuit 60, the frequency division ratio is fixed to 1.000 by M=N=100 of the fixed frequency division number data Dk, and the frequency fo of the signal to be outputted to the output line becomes equal to the frequency fc of the oscillation output signal of the oscillation circuit 20, resulting in no performance of temperature compensation here. In other words, the temperature compensation function is disabled at this time, so that the temperature compensated oscillator shown in FIG. 4 operates as a simple oscillator.

After completion of the adjustment work, "101" is written as selection information into the selection information storage circuit 50 in the non-volatile memory 19 at the time of writing the last compensation data into the compensation data storage circuit 31 or immediately thereafter.

This causes the selection information storage circuit 50 to output selection information of "101" so that the first selection circuit 40A selects the variable switch control signal Sc from the compensation data output circuit 33 of the temperature compensation circuit 30' and outputs it to the oscillation circuit 20. Further, the second selection circuit 40B selects the variable frequency division number data Dc also from the compensation data output circuit 33 and outputs it to the variable frequency division circuit 60.

The oscillation circuit 20 uses the variable switch control signal Sc to selectively turn on one or more of the switches S1 to S5 of the first capacitor array 27 and of the switches S6 to S10 of the second capacitor array 28 each. This changes the combination (connection state) of the enabled capacitors of the first capacitor array 27 and the second capacitor array 28 to vary the capacitance values (oscillation capacitance) of the capacitor arrays 27 and 28 depending on the temperature change, whereby adjustment is performed to compensate the frequency fc of the oscillation signal of the oscillation circuit 20 varying with temperature.

Further, the variable frequency division circuit 60 changes the frequency division ratio in accordance with the values of the frequency division numbers M and N constituting the inputted frequency division number data Dc to set the frequency fo of the output signal to fc×N/M and outputs it. In the example shown in FIG. 6, the frequency of the output signal can be incremented or decremented by 0.1 MHz with respect to 20 MHz.

As described above, when the temperature compensation function is enabled, variations in the oscillation frequency based on the temperature characteristics of the quartz crystal can be compensated by the combination of the adjustment of the value of the oscillation capacitance in the oscillation circuit 20 and the adjustment of the frequency division ratio (multiplication number) in the variable frequency division circuit 60 to output the output signal with a constant frequency to the output terminal 26 at all times.

In this embodiment, another piezoelectric element can also be used as the resonator of the oscillation circuit 20 in place of the quartz crystal.

THIRD EMBODIMENT

Figure 7:
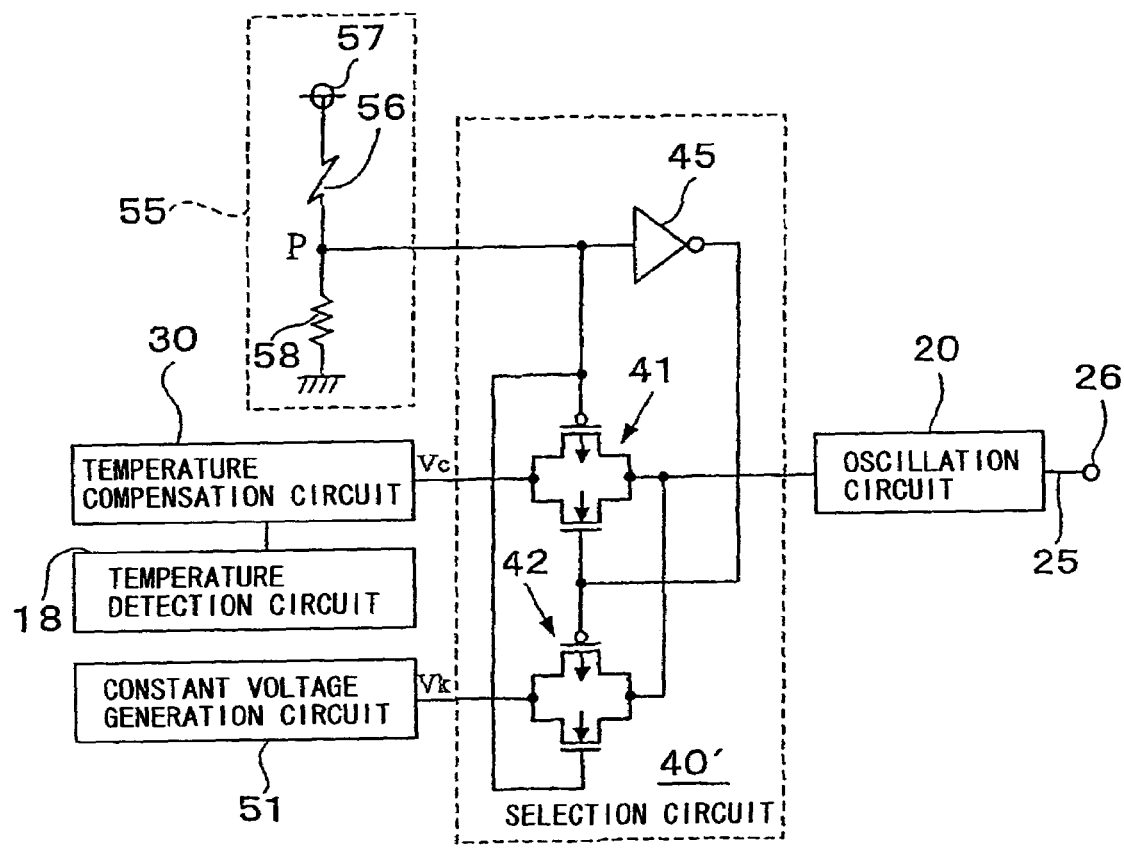
FIG. 7 is a block circuit diagram showing the configuration of a third embodiment of the temperature compensated oscillator according to the invention.

Next, a third embodiment of the temperature compensated oscillator according to the invention will be described with FIG. 7. In FIG. 7, portions equivalent to those in FIG. 1 are assigned the same numerals and symbols, and the description thereof will be omitted.

In the temperature compensated oscillator shown in FIG. 7, its selection circuit 40' is a circuit made by omitting the NAND circuit 43 and the inverter 44 from the selection circuit 40 shown in FIG. 1, and a selection information storage circuit 55 using a predetermined conductive pattern 56 is provided in place of the selection information storage circuit 50 constituted of a non-volatile memory in the temperature compensated oscillator shown in FIG. 1. Incidentally, the external terminal 52 in FIG. 1 is not provided.

The conductive pattern 56 is formed, for example, in the package main body 11 shown in FIG. 8 or on an insulated substrate provided at a position in the external part where it can be operated from the outside after completion of the initial adjustment. One end of the conductive pattern is connected to a positive power source line 57 and the other end is grounded via a resistor 58. The voltage level at a P point that is a connection point between the conductive pattern 56 and the resistor 58 is outputted as binary selection information to the selection circuit 40' and is inputted to each gate of transmission gates 41 and 42 directly or after inversion by an inverter 45 as shown in the drawing.

In the initial state, the conductive pattern 56 of the selection information storage circuit 55 is conducted in which the voltage level at the P point is high "1," and therefore the transmission gate 42 of the selection circuit 40' is on and the transmission gate 41 is off. Accordingly, a constant voltage Vk outputted by the constant voltage generation circuit 51 passes through the transmission gate 42 to be supplied to an oscillation circuit 20 and fix the value of the oscillation capacitance of the oscillation circuit 20 to a predetermined value, thereby disabling the temperature compensation function.

After completion of the initial adjustment, when the conductive pattern 56 of the selection information storage circuit 55 is cut, the voltage level at the P point becomes the ground level, that is, low "0," and therefore the transmission gate 41 is turned on and the transmission gate 42 is turned off. Accordingly, a control voltage Vc outputted by a temperature compensation circuit 30 in accordance with a temperature detection signal from a temperature detection circuit 18 is supplied to the oscillation circuit 20 via the transmission gate 41 to vary the oscillation capacitance value of the oscillation circuit 20 depending on the temperature change.

Consequently, even if the environmental temperature varies, the temperature compensation function effectively operates to keep constant the oscillation frequency, that is, the frequency of the signal outputted to the output terminal 26 via the output line 25.

Modification Example of Embodiments

While the temperature compensation function is enabled by bringing the selection information of the selection information storage circuit 50 into "101" in the above-described first and second embodiments, the invention is not limited to this, any data may be employed as the selection information, and the number of digits of the data can be any number. Incidentally, the non-volatile memory or the like constituting the selection information storage circuit 50 is generally likely to have data in the initial state of all "1" or all "0," and therefore it is preferable to set data to other than "111" or "000" as the above-described selection information.

INDUSTRIAL APPLICABILITY

As has been described, in the temperature compensated oscillator according to the invention, in a state in which a piezoelectric element such as a quartz crystal or the like, an IC chip, and so on are mounted in a package to constitute the temperature compensated oscillator, its oscillation circuit is operated, and the temperature characteristics of the piezoelectric element itself can be accurately adjusted.

Further, the work of creating the compensation data thereafter and storing it into the compensation data storage circuit can also be accurately performed subsequent thereto, whereby the adjustment steps can be simplified and increased in accuracy.

Consequently, improvements in performance of the portable mobile communication device into which this oscillator is incorporated can be realized without an increase in cost.

What is claimed:

1. A method of manufacturing a temperature compensated oscillator comprising the steps of:

assembling an oscillator in which an IC chip constituting a temperature compensation circuit with an oscillation circuit and a compensation data storage circuit, and a resonator for said oscillation circuit are mounted in a package, adjusting said resonator so that an oscillation frequency of said oscillation circuit becomes a desired oscillation frequency in condition that a temperature compensation function of said temperature compensation circuit is disabled, said oscillator is kept at a reference temperature, and said resonator and said IC chip are mounted in the package, sealing said resonator hermetically after said step of adjusting said resonator, creating temperature compensation data and storing it into said compensation data storage circuit, and enabling said temperature compensation function of said temperature compensation circuit in condition that the temperature compensation data is stored in said compensation data storage circuit.

2. The method of manufacturing a temperature compensated oscillator according to claim 1, wherein said package is put into a constant temperature chamber in order to keep said oscillator at the reference temperature in the step of adjusting said resonator.

3. The method of manufacturing a temperature compensated oscillator according to claim 1, wherein said package is put into a constant temperature chamber in the step of creating the temperature compensation data and storing it into said compensation data storage circuit.

4. The method of manufacturing a temperature compensated oscillator according to claim 1, wherein said temperature compensation data is created based on measurement values gained by measuring the oscillation frequency of said oscillation circuit at each of the temperature states and the difference with respect to said desired oscillation frequency with exposure of said oscillator to a plurality of temperatures, in the step of creating the temperature compensation data and storing it into said compensation data storage circuit.

5. The method of manufacturing a temperature compensated oscillator according to claim 4, wherein the plurality of temperatures in which said oscillator is exposed to are set at appropriate points in an operation guaranteed temperature range of said oscillator.

6. The method of manufacturing a temperature compensated oscillator according to claim 5, wherein said operation guaranteed temperature range is from minus 40° C. to plus 100° C., and a number of said points is 11.

7. The method of manufacturing a temperature compensated oscillator according to claim 1, wherein the temperature compensation function is enabled by particular selection information in the step of enabling the temperature compensation function of said temperature compensation circuit.

8. The method of manufacturing a temperature compensated oscillator according to claim 7, wherein said particular selection information is information with a pre-assigned combination of a plurality of bits.

9. The method of manufacturing a temperature compensated oscillator according to claim 1, wherein the step of adjusting said resonator is performed by the steps of:

depositing a metal film on a surface of said resonator allowing a resonant frequency to be lower than the reference frequency in advance, and applying an ion beam to an electrode film on the surface of said resonator or sputter etching for the electrode film to gradually decrease the mass of the electrode film.

* * * * *